United States Patent
Sugawara et al.

[11] Patent Number: 6,020,602
[45] Date of Patent: Feb. 1, 2000

[54] GAN BASED OPTOELECTRONIC DEVICE AND METHOD FOR MANUFACTURING THE SAME

[75] Inventors: Hideto Sugawara; Masayuki Ishikawa, both of Tokyo, Japan

[73] Assignee: Kabushiki Kaisha Toshba, Kanagawa-ken, Japan

[21] Appl. No.: 08/925,271

[22] Filed: Sep. 8, 1997

[30] Foreign Application Priority Data

Sep. 10, 1996 [JP] Japan .................................. P8-239335

[51] Int. Cl.$^7$ ................. H01L 33/00; H01S 3/19
[52] U.S. Cl. .................. 257/103; 257/97; 372/45; 372/50
[58] Field of Search ............... 257/103, 97; 372/45, 372/50, 43

[56] References Cited

U.S. PATENT DOCUMENTS

| 4,903,088 | 2/1990 | Van Updorp | 257/103 |
| 5,780,876 | 7/1998 | Hata | 372/50 |

FOREIGN PATENT DOCUMENTS 8-8460  1/1996  Japan .

OTHER PUBLICATIONS

Van Vechten, et al.; "Defeating Compensation in Wide Gap Semiconductors by Growing in H That is Removed by Low Temperature De–Ionizing Radiation", Jpn. J. Appl. Phys. vol. 31, Part 1, No. 11, Nov. 1992, pp. 3662–3663.

Amano, et al.; "P–Type Conduction in Mg–Doped GaN Treated with Low–Energy Electron Beam Irradiation (LEEBI)", Jpn. J. Appl. Phys. vol. 28, No. 12, Dec. 1989, pp. L2112–L2114.

Nakamura, et al.; "Hole Compensation Mechanism of P–Type GaN Films", Jpn. J. Appl. Phys. vol. 31, Part 1, No. 5A, May 1992, pp. 1258–1266.

*Primary Examiner*—Jerome Jackson, Jr.
*Attorney, Agent, or Firm*—Finnegan, Henderson, Farabow, Garrett & Dunner, L.L.P.

[57] ABSTRACT

An n-cap layer is formed on a top surface of p-type clad layers, the p-type clad layer is a top layer of a stacked structure having a pn-junction for emitting carriers into light-emitting region of a GaN based light-emitting device, thus increasing the activation ratio of acceptor impurities in the p-type clad layers. The n-cap layer is used also as a current blocking layer, thereby constructing a current-blocked structure. The n-cap layer should preferably be made of $In_uAl_vGa_{1-u-v}N$ ($0<u$, $v<1$) deposited as thick as 1.0 micron or more. The present invention will easily provide a high luminous efficiency GaN based semiconductor light-emitting device without using any complicated processes such as electron-beam irradiation or thermal annealing.

11 Claims, 8 Drawing Sheets

GAN BASED OPTOELECTRONIC DEVICE AND METHOD FOR MANUFACTURING THE SAME

BACKGROUND OF THE INVENTION

1. Field of the Invention

The present invention relates in general to optoelectronic devices (such as light-emitting diodes (LEDs) or semiconductor lasers made of compound semiconductor materials) and a method for manufacturing the devices. More particularly, the present invention relates to semiconductor light-emitting devices made of gallium nitride (GaN) based semiconductor material and a method for manufacturing the same. Such devices are essential for developing full color displays and, in the case of coherent light sources, high density optical storage technologies. Also, the devices are very likely to be used as devices for signal and illumination applications.

2. Description of the Prior Art

The GaN based semiconductors such as $In_xAl_yGa_{1-x-y}N$ show high-efficiency radiative recombinations due to their direct transition natures. And, in view of the available wide range of bandgaps from 2.0 eV to 6.2 eV, the GaN based semiconductors have been developed as materials for high-efficiency light-emitting devices such as short wavelength semiconductor lasers and high-brightness short wavelength LEDs, which are active in the green, green-blue, blue, and ultra-violet (UV) spectral regions.

$In_xAl_yGa_{1-x-y}N$, a quarternary semiconductor, is basically combined of nitride based (N-based) binary semiconductors such as GaN, aluminum nitride AlN, and indium nitride (InN). Among the N-based compound semiconductors, GaN has been widely employed as a material of optoelectronic devices. However, GaN has a rather high melting point of 1700° C. or higher as well as an extremely high equilibrium vapor pressure of nitrogen at the growth temperature, so that its stoichiometric composition (stoichiometry) is hard to control and therefore is difficult to grow bulk single-crystals. Presently, therefore, its single-crystalline growth technique mainly employs the halide vapor-phase epitaxy (HVPE) method. Recently the growth techniques that employ the metalorganic chemical vapor deposition (MOCVD) method in particular have greatly been developed, thus permitting ternary crystals such as $In_xGa_{1-x}N$ or $Al_yGa_{1-y}N$ to be obtained by mixing In or Al into GaN. By using a heterojunction that combines a plurality of such III–V nitrides, the luminous efficiency can be improved. By forming a double heterojunction (DH) structure, where the active region is bounded on both sides by higher bandgap materials, effective particularly in the confining of injected carriers and optical radiations, it is possible to provide high-brightness short-wavelength LEDs and short-wavelength semiconductor lasers.

To manufacture current-injection type light-emitting devices, which are based on a pn junction, it is important to control the electrical properties, so as to form desired p-type and n-type semiconductor regions. In GaN based semiconductors, the n-type doping can be relatively easily controlled by using Si as n dopant atoms. The hole concentrations in the p-type semiconductor regions, however, are generally hard to control and concerted efforts were made to dope GaN based semiconductor p-type. This is probably because that magnesium (Mg) and zinc (Zn), which are used as a main acceptor impurity for p-type semiconductor regions, have deep energy levels (large binding energies) and so low activation ratios (of $10^{-2}$–$10^{-3}$). Further, the growth by MOCVD method causes a passivation of acceptors by atomic hydrogen (H), which is a decomposition product of ammonia ($NH_3$) used as a source gas (J. A. Van Vechten, et al. Jpn. J. Appl. Phys. 31 (1992) 3662).

That is, one known problem is that in the growth of a Mg-doped GaN layer by the MOCVD method etc., when the substrate temperature is lowered down to the room temperature (during which an $NH_3$ gas generally continues to be supplied as a source of the column V element to avoid dissociation of N from the surface of the growth layer), the growth layer incorporates atomic H, which passivate the acceptors, thus providing a high resistivity of the Mg-doped GaN layer. In the case of a GaN layer in which Mg is doped as much as $1\times10^{20}$ cm$^{-3}$, its H concentration becomes $5\times10^{19}$ cm$^{-3}$, which generally results in 10 times or more as much as the case of an undoped and n-type GaN layers grown under the same conditions in terms of atomic H incorporation.

To overcome this problem, it has been found that the activation ratio can be improved by performing low energy electron beam irradiation (LEEBI) (H. Amano, et al. Jpn. J. Appl. Phys. 28 (1989) L2112). Subsequently it was discovered that thermal annealing at 700° C. under $N_2$ ambient can serve the same purpose as LEEBI process (S. Nakamura, et al. Jpn. J. Appl. Phys. 31 (1992) 1258), thus giving a possibility of realizing high-efficiency light-emitting devices. These methods, however, suffer in a respect that a complicated process of electron-beam irradiation or thermal annealing must be added in processing. Moreover, the process of LEEBI requires a complicated and expensive electron-beam irradiation equipment, increasing the cost of manufacturing.

Moreover, high-efficiency LEDs require high light extraction efficiency for their realization. Hence, it is necessary to provide such a special structure as used in the LEDs made of $Ga_xAl_{1-x}As$ or GaP. This structure specifically attempts to increase the angle of cone of emission by growing a thick transparent layer with a low electrical resistivity. This structure is used to expand an internal light-emitting region, so as to take the light out of the device without being shielded by the electrode. With the GaN based materials, especially p-type ones, however, it is difficult to obtain crystals with a low resistivity. Moreover, the surface morphology deterioration due to the heavy doping becomes significant by making the transparent layer thicker. To improve the light extraction efficiency for GaN based LEDs, therefore, another method is proposed to form a current-blocked structure using an oxide film in order to prevent carrier injections in the light shielded area; this method, however, suffers in a respect that a process of oxide film deposition must be added, complicating the manufacturing processing.

In view of the foregoing discussion, to achieve a higher luminous performance of the conventional GaN based light emitting devices, it has been necessary to perform such complicated manufacturing processes as the LEEBI process and the thermal annealing for activating the acceptors or the special deposition process for forming oxide films. Those complicated processes and addition of new processes have adverse effects on the reproducibility and the reliability of the device characteristics, thus giving significant problems such as increased product costs and deteriorated yield.

SUMMARY OF THE INVENTION

It is therefore an object of the present invention to provide a high-brightness light-emitting device or other optoelectronic device that simplifies manufacturing processes and also enjoys high characteristic reproducibility and reliability in the formation of GaN based semiconductor devices.

More specifically, it provides a structure of light-emitting devices with a high light extraction efficiency as well as a high luminous performance, in which acceptor impurities are activated without using such special processes as the LEEBI process and the thermal annealing.

Another object of the present invention is to provide a simple structure of light-emitting devices made of GaN based semiconductors that is capable of providing easy control of the p-type doping and high internal quantum efficiency.

A further object of the present invention is to provide a method, in the formation of GaN based optoelectronic devices, for manufacturing high-brightness light-emitting devices and other optoelectronic devices that simplifies the manufacturing processes and provides high characteristic reproducibility and reliability.

A still further object of the present invention is to provide a simple method for manufacturing optoelectronic devices with a high light extraction efficiency and a high internal quantum efficiency, by which acceptor impurities are activated without employing such special processes as the LEEBI process and the thermal annealing.

An additional object of the present invention is to provide a method for manufacturing GaN based optoelectronic devices inexpensively with a high yield, which is capable of providing easy control of the p-type doping, thereby providing the optoelectronic device having a high luminous efficiency.

To this end, an optoelectronic device according to the present invention generally comes in a semiconductor light-emitting device which is formed in a structure that stacks GaN based semiconductors represented by a general expression of $In_xAl_yGa_{1-x-y}N$ ($0 \leq x$, $y \leq 1$), so that this stacked structure comprises at least an n-type semiconductor region and a p-type semiconductor region for injecting electrons and holes respectively, featuring first an n-cap layer formed on the p-type semiconductor region.

More specifically, the optoelectronic device features, in light-emitting devices in which a p-type GaN based semiconductor layer are formed on an n-type GaN based semiconductor ($In_xAl_yGa_{1-x-y}N$) layer, such a structure that a cap layer made of n-type GaN based semiconductor is formed on this p-type GaN based semiconductor. This structure may be realized by forming a pn junction using a p-type semiconductor layer and a n-type semiconductor layer or by forming a p-i-n junction using an undoped semiconductor layer which acts as an intrinsic semiconductor layer (i-type layer) sandwiched between p-type and n-type semiconductor layers. Also, to improve the surface morphology and crystal quality, this structure may be realized by forming a buffer layer of an undoped or n⁻-type semiconductor layer between the n-type semiconductor layer and the substrate. The buffer layer may come in either n-type or p-type. It also may be of either a homo-junction, single-hetero (SH) junction, or double-hetero (DH) junction.

More specifically, a p-type GaN based semiconductor layer according to the present invention is a GaN based semiconductor that contains Mg or Zn as an acceptor impurity. The first feature of the present invention lies in a structure that n-type cap layer is stacked on this p-type semiconductor layer. This cap layer should preferably be formed of $In_uAl_vGa_{1-u-v}N$ (0<u, v<1). It is preferable to employ this combination of semiconductor layers as a current-blocked structure (layers 304 and 305) shown in FIG. 3A.

FIG. 2A shows a Mg concentration profile measured along a depth direction from an n-cap layer 305, using a secondary ion mass spectroscopy (SIMS), for a stacked structure constituting the first feature of the present invention. The profile of Mg concentration in the n-cap layer 305 is expressed two ways: in a solid line for the case where the time for growth interruption step between a p-type semiconductor layer 304 and the n-cap layer 305 is one (1) second; and in a broken line for the case where the growth interruption time is 30 seconds. Here, "the growth interruption" means the step in which only (a) specified gas(es) is(are) introduced on the substrate, while keeping the substrate temperature at a growth temperature. As shown in FIG. 2A, a growth interruption step gives a steep impurity profile at the boundary between stacked layers. FIG. 2B shows a dependency of the hydrogen (H) concentration in the p-type semiconductor layer 304 on the thickness of the n-cap layer. It can be seen that if the n-cap layer 305 is 1 micron or more in thickness, the H concentration is $5 \times 10^{18}$ cm$^{-3}$. FIG. 2B includes the H concentration in a conventional structure in which the n-cap layer is not stacked. It is known that the H concentration by the prior art indicated by a circle is $5 \times 10^{19}$ cm$^{-3}$, which tells that the p-type GaN layer has 10 times or more of H incorporation as compared to undoped and n-type GaN layers grown under the same conditions. In contrast to this, with an n-cap structure which constitutes the first feature of the present invention, the H concentration in a Mg-doped GaN layer 304 is lowered to almost the same level as the undoped or n-type GaN layers. By properly changing an impurity concentration etc. of the n-cap layer 305 or the p-type semiconductor layer 304, entrapment of hydrogen can be inhibited in some cases if the n-cap layer is 0.1 micron or more in thickness. However, if this n-cap layer is 1 micron or more in thickness, inclusion of H can surely be inhibited. As mentioned later, the greatest feature of the present invention is the optimized conditions for the mutual correlation among those four parameters of the impurity concentration of the n-cap layer 305 and that of the p-type semiconductor layer 304, the thickness of the n-cap layer 305, and conditions for growth interruption between the p-type semiconductor layer 304 and the n-cap layer 305. When the top n-type GaN cap layer 305 was removed after a consecutive epitaxy, by which such an optimized structure as shown in FIG. 1 is grown, the Mg-doped GaN layer 304 measured a low resistivity (1Ω-cm) and p-type characteristics ($1 \times 10^{18}$ cm$^{-3}$). That is, according to the first feature of the present invention, it is possible to obtain, without any thermal annealing, almost the same value of activation ratio for the p-type GaN based semiconductor layer 304 as those obtained in conventional Mg-doped GaN layers activated by the thermal annealing. Also, the H concentration in the p-type semiconductor layer (see, FIG. 2B) measured almost the same as those obtained with thermal annealing. By providing a stacked structure such as shown in FIG. 1 or FIG. 3A, according to the first feature of the present invention, therefore, incorporation of atomic H into the Mg-doped layer can be inhibited, thus obtaining low resistivity p-type GaN layers without adding such activation processing as thermal annealing or such special LEEBI treatment. Once adsorption of atomic H is inhibited, the n-cap layer 305 can be removed subsequently. FIGS. 3A and 3B show a structure that the n-cap layer 305 is once formed throughout on the p-type clad layer 304 and then is selectively removed. Even when the n-cap layer 305 is removed partially in a subsequent step, the effects of improving the acceptor activation ratio remains the same, thus controlling the p-type impurity to a proper profile.

The second feature of the present invention relates to a method for manufacturing GaN based optoelectronic device such as light-emitting devices. More specifically, it relates to a semiconductor device that emits a prescribed wavelength of light by a stacked structure comprising n-type GaN based semiconductor layers and p-type GaN based semiconductor layers, including at least a step of growing as thick as 1 micron or more a cap layer made of n-type $In_uAl_vGa_{1-u-v}N$ (0<u, v<1) just adjacent to p-type GaN semiconductor layers.

According to the second feature of the present invention, during a series of vapor-phase epitaxial (VPE) growth steps, only by performing a simple improvement, i.e., by adding a single step of forming n-type $In_uAl_vGa_{1-u-v}N$ cap layers, the acceptor activation ratio can be improved, to lower the resistivity of the p-type layers. As a result, the luminous efficiency of the semiconductor light-emitting devices can also be improved. Here, the VPE growth includes the HVPE, MOCVD, ultra low pressure MOCVD.

Also, according to the second feature of the present invention, it is unnecessary to add any special complicated and time-consuming steps to lower the resistivity of the p-type layers. This feature can simplify the processes for manufacturing the devices, improving the manufacturing yield and productivity. Moreover, the devices can be manufactured in a shorter period of time, to lower the production costs, having great industrial merits.

The third feature of the present invention relates to a method for manufacturing GaN based optoelectronic device such as light-emitting devices. More specifically, it relates to a method for manufacturing light-emitting devices that includes at least a step of consecutively growing an n-type clad layer, an active layer, a p-type clad layer, and an n-type $In_uAl_vGa_{1-u-v}N$ cap layer (0<u, v<1) in the same growth chamber in this order to form a stacked structure. The n-type $In_uAl_vGa_{1-u-v}N$ layer is stacked as thick as 1 micron or more. "Consecutively" here means that those layers are to be grown "without exposing to the air." That is, this concept may include the above-mentioned "growth interruption" step that partially (or totally) stops a supply of source gases halfway. The present invention would rather preferably include the "growth interruption" step as one step of consecutive growth.

According to the third feature of the present invention, during a series of consecutive VPE growth steps, by growing n-type $In_uAl_vGa_{1-u-v}N$ cap layers, the acceptor activation ratio can be improved, to lower the resistivity of the p-type layer. Here, the VPE growth includes the HVPE, MOCVD, ultra low pressure MOCVD. As a result, the luminous efficiency of the semiconductor light-emitting devices is also improved. Also, a current-blocked structure can be realized easily by using a stacked structure by means of the consecutive epitaxial growth method, so that the external quantum efficiency is even more improved. This third feature of the present invention can simplify the processes for manufacturing the devices, thus improving the manufacturing yield as well as the productivity. Moreover, the time required for manufacturing can be reduced, thereby lowering the virtual production costs.

A growth method according to the third feature of the present invention should preferably be the MOCVD method; specifically, on a p-type GaN based semiconductor layer containing Mg as an acceptor impurity, cap layers made of n-type $In_uAl_vGa_{1-u-v}N$ should preferably be grown consecutively after the "growth interruption" step which supplies only the specified gases of an $NH_3$ gas and a carrier gas.

The fourth feature of the present invention relates to a method for manufacturing GaN based optoelectronic devices. More specifically, it relates to such a method that on a prescribed substrate made of, for example, sapphire, n-type GaN based semiconductor layers and p-type GaN based semiconductor layers are stacked into one structure by the VPE growth method, and when the top layer of that structure is formed, a supply is stopped of a column-III element source gas such as TMG and a column-V element source gas such as $NH_3$, to lower the substrate temperature from a growth temperature down to the room temperature, while supplying a carrier gas. Here, the VPE growth includes the HVPE, MOCVD and ultra low pressure MOCVD. The carrier gas here should preferably be an inert gas such as nigrogen ($N_2$), argon (Ar), or helium (He). In particular, it is more preferable that the carrier gas is $N_2$ or composite gas containing $N_2$ in view of the changes in the stoichiometric composition due to the dissociation (re-vaporization) of nitrogen from the surface of N-based III–V material.

Also, to avoid complexity in operation at time of lowering the substrate temperature, it is preferable to use, as the carrier gas for the VPE growth, the same inert gas as that used at time of temperature lowering. By lowering the substrate temperature in the inert gas ambient, atomic H produced by the dissociation of $NH_3$ can be prevented, from being adsorbed on a surface of the epitaxial-growth layer, thus improving the activation ratio for an acceptor impurity.

The fifth feature of the present invention relates to such a manufacturing method that on a substrate made of, for example, sapphire, an n-type GaN based semiconductor layer and a p-type GaN based semiconductor layer are stacked into one structure by the VPE growth method, and after this stacked structure as a whole is grown to a preliminary thickness larger than a finally required thickness, a carrier gas such as $H_2$ or composite gas containing $H_2$ is used as the atmosphere in which the substrate temperature is lowered from the growth temperature down to the room temperature, to carry out vapor-phase etching of the surface of epitaxial-growth layer, thereby obtaining final desired thickness. Also by lowering the temperature while carrying out vapor-phase etching on the substrate, inclusion of atomic H into the epitaxial-growth layer can be inhibited, thereby improving the activation ratio of the acceptor impurity.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Figure 1:
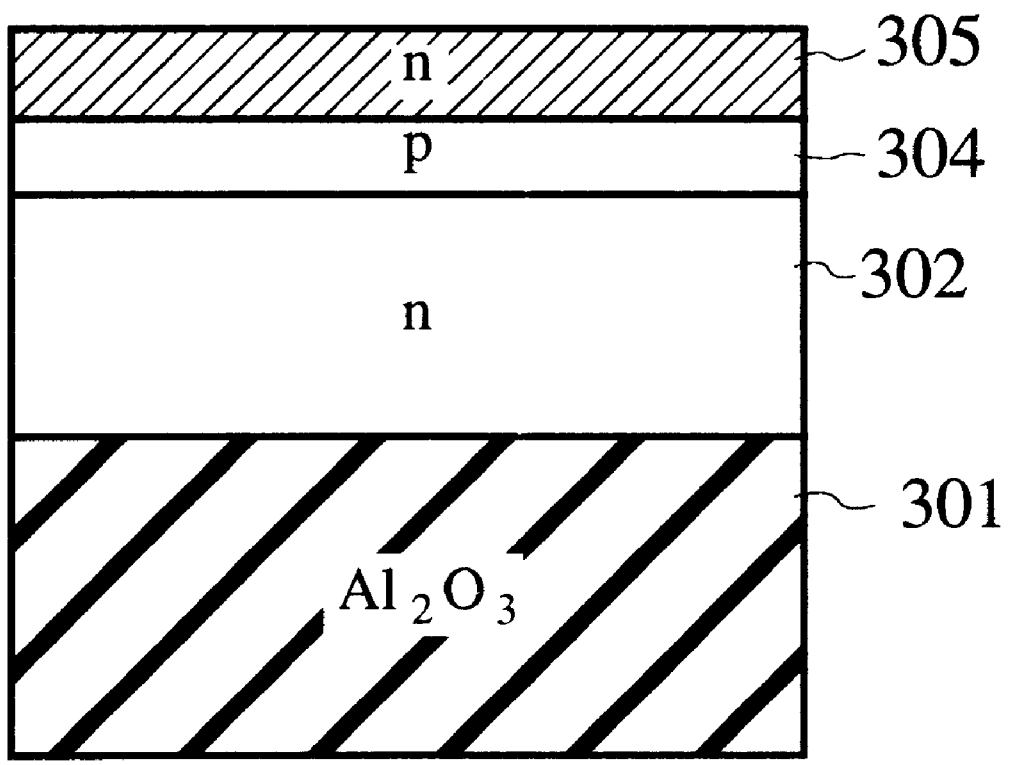
FIG. 1 is a cross-sectional view of basic art (principles) for a GaN based semiconductor optoelectronic device related to the first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of optoelectronic devices, it will be appreciated that the various drawings are not drawn to scale from one figure to another nor inside a given figure, and in particular that the layer thickness are arbitrarily drawn for facilitating the reading of the drawings.

[First Embodiment]

First, the basic technologies for stacking GaN based semiconductor ($In_xAl_yGa_{1-x-y}N$) layers that underlie the first embodiment of the present invention are described below with reference to a consecutive epitaxial growth of GaN.

FIG. 1 is a cross-sectional view of a stacked structure of a GaN based optoelectronic device related to the underlying technologies of the first embodiment of the present invention. In it, reference numeral 301 indicates a substrate made of sapphire ($Al_2O_3$), on a part of whose main surfaces are consecutively stacked an Si-doped n-type GaN layer 302, a Mg-doped p-type GaN layer 304, and an Si-doped n-type GaN layer (n-cap layer) 305 in this order. Those layers are stacked by means of the MOCVD method or other VPE growth method, using ammonia ($NH_3$) as the column-V element source gas; TMG($Ga(CH_3)_3$), TEG($Ga(C_2H_5)_3$), etc. as the column-III element source gas; biscyclopentadienyl-magnesium ($Cp_2Mg$), mono-silane ($SiH_4$), etc. as the dopant gas; and a mixed gas of $H_2/N_2$ as the carrier gas. Those layers have thicknesses as follows:

n-type GaN layer 302: 2.0 microns
p-type GaN layer 304: 1.0 micron
n-type GaN layer 305: 1.0 micron If, for example, $Cp_2Mg$ is used as the dopant gas for the p-type GaN layer and Mg is used as the acceptor atom, it is difficult to obtain a steep profile of Mg at the crystal boundary because of the memory effects of the Mg containing material ($Cp_2Mg$). That is, if any other layer is consecutively grown on the Mg-doped p-type GaN layer 304, Mg is doped also in the top layer, so that it is difficult to grow an n-type layer on the p-type layer. To prevent the memory effects of Mg, the present invention supplies a Mg containing source gas ($Cp_2Mg$) through other piping independently of the other source gas pipings used and also carries out "growth interruption" step at the boundary between this Mg-doped layer and the n-type layer 305 grown thereon. The "growth interruption" step may be carried out for one to 10 minutes with supplying only an $NH_3$ gas and a carrier gas, while keeping the substrate temperature at a growth temperature, after stopping the supply of other source gases including the column III metalorganics.

In order to inhibit the memory effects of Mg and increase the activation ratio of Mg, which is an object of the present invention, it is necessary, as described below, to optimize the Mg (acceptor) concentration contained in the p-type GaN layer 304, the Si (donor) concentration contained in the n-cap layer 305, the thickness of the n-cap layer 305, and the conditions for the above-mentioned growth interruption step.

The doping quantity of Mg and Si has its upper limit in relation to the surface morphology of the doping layer. If the concentration of Mg and Si contained in GaN crystals exceeds $2\times10^{20}$ cm$^{-3}$ and $5\times10^{19}$ cm$^{-3}$ respectively, the surface morphology develops roughness. And it becomes undesirable for device application taking into account a steepness of the impurity profile at the boundary. Also, the activation ratio of Mg and Si contained in GaN crystals are about 10% and 90% or higher respectively. To increase a p-type carrier concentration especially in Mg doping, it is necessary to carry out heavy doping of Mg. Under these conditions, the present invention substantially sets the Mg concentration contained in a p-type GaN layer at $1\times10^{20}$ cm$^{-3}$. "Substantially" here means that it is not always necessary to set it at an exact value of $1\times10^{20}$ cm$^{-3}$ but in an approximate range of $5\times10^{19}$ cm$^{-3}$ through $1.5\times10^{20}$ cm$^{-3}$. That is, that value approximately intends to be an upper limit of the impurity concentration that will not deteriorate the surface morphology.

Figure 2A:
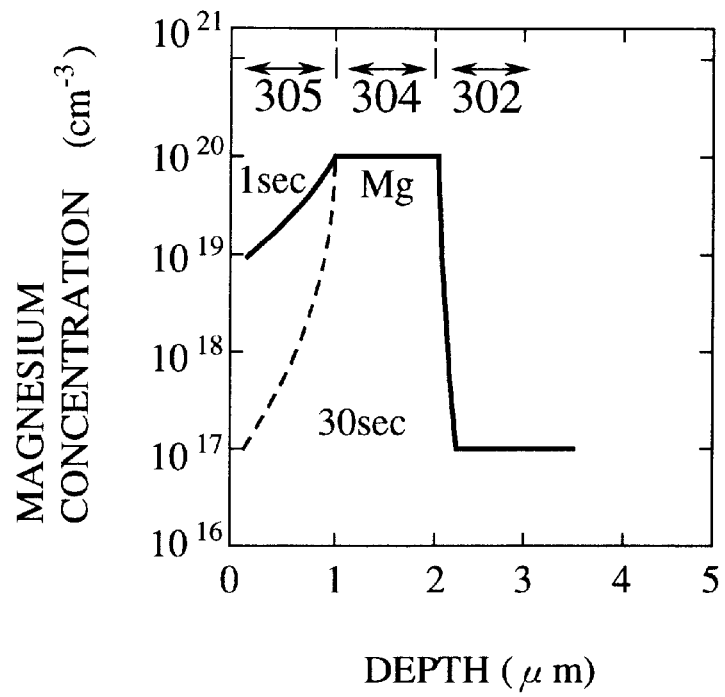
FIG. 2A is Mg profiles in a stacked structure shown in FIG. 1 measured along the film-thickness direction by the secondary ion mass spectrometry (SIMS)

FIG. 2A shows Mg concentrations versus its film thickness in depth direction as measured by the SIMS in the case where the Mg concentration contained in the p-type GaN layer 304 in a structure shown in FIG. 1 is set at $1\times10^{20}$ cm$^{-3}$. FIG. 2A, which indicates the measured results for two sets of growth interruption conditions, tells that under these two sets of conditions, the Mg concentrations change because of the memory effects of Mg contained in the n-cap layer 305. That is, the solid line gives the profile in the case where the growth interruption time at the boundary between the n-cap layer 305 and the p-type GaN layer 304 is set at one second, while the broken line gives that in the case where that growth interruption time is set at 30 seconds. As mentioned above, this growth interruption step intends to supply only a carrier gas and $NH_3$ gas and keep the substrate temperature at a growth temperature. As shown in FIG. 2A, it is possible to reduce the memory effects of Mg by elongating the growth interruption time. Further repeating of various experiments by present inventors has shown that when the growth interruption time reaches or exceeds 30 seconds, the effects gradually increase and then level off. It has also been shown that when the growth interruption time reaches or exceeds 30 minutes, nitrogen is dissociated significantly from the crystals, giving rise to heavy roughness in the surface morphology in the case where the n-cap layer 305 has been grown. The growth interruption time in the present invention, therefore, should preferably be rather a long time, but less than 30 minutes. Also, in order to employ the present structure advantageously, the cap layer 305 must be made n-type as mentioned earlier, so that it becomes necessary to control the doping level of Si contained in the n-cap layer 305 and its thickness depending on the situation of the memory effects of Mg. If, for example, the growth interruption time is set at 30 seconds as shown in FIG. 2A, the required conditions can be met by setting the Si concentration at $1\times10^{18}$ cm$^{-3}$ or higher. Also, taking into account the roughness in the surface morphology caused by heavy doping of Mg and Si, those conditions can be met sufficiently by setting the Si concentration contained in the n-cap layer at $2\times10^{18}$ cm$^{-3}$.

Figure 2B:
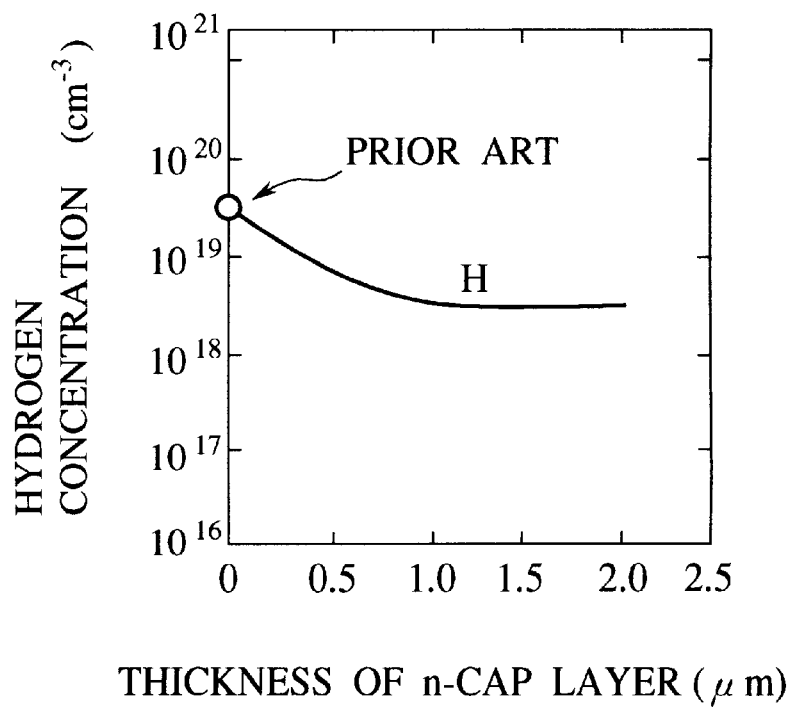
FIG. 2B is a graph illustrating a dependency of hydrogen concentration onto the thickness of n-cap layers.

FIG. 2B shows a relationship between the thickness of the n-cap layer 305 and the H concentration in the GaN layer 304. In it, the concentration of Si in the n-cap layer 305 is $5\times10^{18}$ cm$^{-3}$ and that of Mg in the Mg-doped GaN layer 304, $1\times10^{20}$ cm$^{-3}$. In FIG. 2B, the result for the prior art, which has no n-cap layer 305, is also indicated by a circle. That is, when the substrate temperature has been lowered down to the room temperature (during which an NH$_3$ gas—as a column-V element source gas—continues to be supplied to avoid the dissociation of H from the surface of the growth layer) without forming the n-cap layer 305 after the Mg-doped GaN layer 304 was formed, the H concentration is $5\times10^{19}$ cm$^{-3}$. If an n-cap layer is formed on the other hand, as the n-cap layer 305 increases in thickness, the H concentration decreases; if the thickness is 1.0 micron for example, incorporation of hydrogen decreases down to $5\times10^{18}$ cm$^{-3}$, at around which the effects level off even if that thickness increases further, as can be seen from FIG. 2B. This H incorporation value of $5\times10^{18}$ cm$^{-3}$ is almost equivalent to the value with the case where an undoped or n-type doped GaN layer is grown. Also, when a structure such as shown in FIG. 1 was obtained by the consecutive epitaxial growth method and then the top layer, the n-type GaN-cap layer 305, was removed, the electrical characteristics were of a p type ($1\times10^{18}$ cm$^{-3}$) with a low resistivity (1 Ω-cm). These characteristics are almost equivalent to those in the case where a Mg-doped GaN layer according to the prior art was activated by thermal annealing. Moreover, both cases had almost the same H concentration contained in the crystals. By providing such an n-cap structure as shown in FIG. 1, adsorption of atomic H on the surface of the Mg-doped layer can be inhibited, thus obtaining p-type GaN layers having a high activation ratio, i.e. a low resistivity, without carrying out any special activation processing such as thermal annealing or LEEBI treatment. Although the above has been described with reference to a case where the composition is x=y=0, the present invention can of course be applied more generally to a stacked structure of In$_x$Al$_y$Ga$_{1-x-y}$N layers.

Figure 3A:
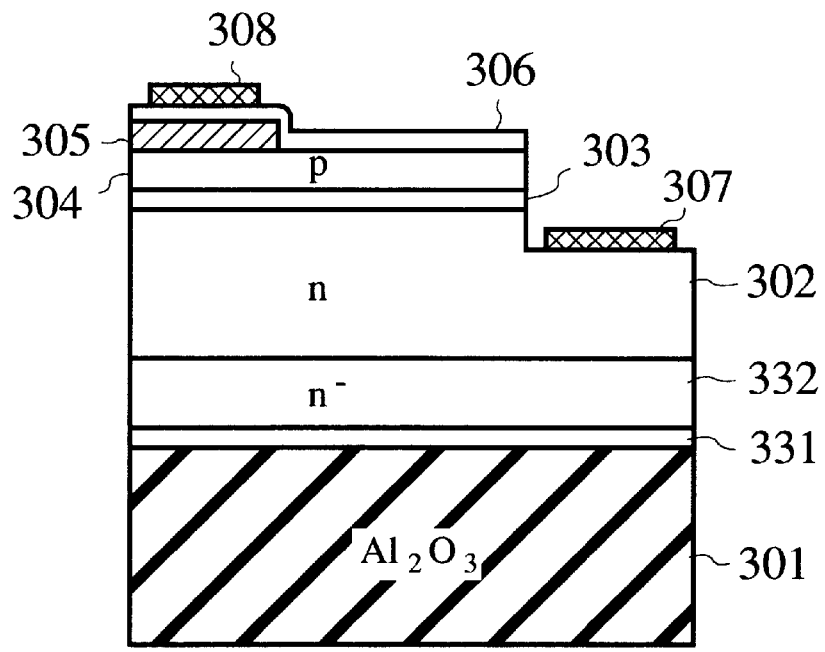
FIG. 3A is a cross-sectional view of a GaN based semiconductor LED related to the first embodiment of the present invention.
Figure 3B:
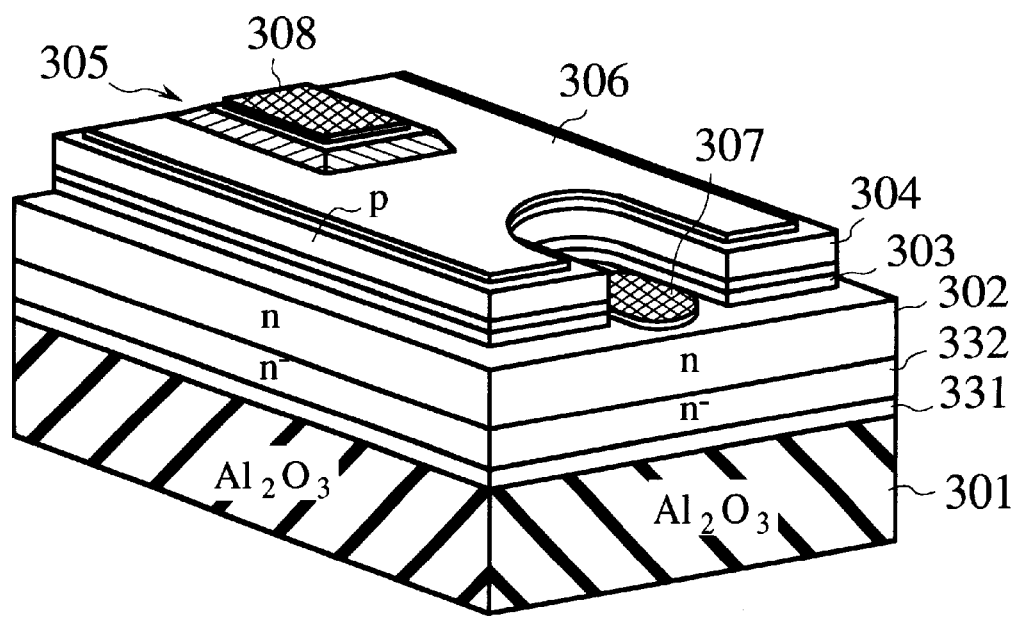
FIG. 3B is a bird's-eye view of FIG. 3A.

FIG. 3A is a cross-sectional view illustrating an LED as an example of the optoelectronic device made of GaN based materials related to the first embodiment of the present invention and FIG. 3B, its bird's-eye view. This LED has such a structure that on the sapphire substrate 301 are stacked an In$_x$Al$_y$Ga$_{1-x-y}$N layer, a GaN layer, and an In$_x$Ga$_{1-x}$N layer having the respective film thicknesses as follows:

n-type In$_x$Al$_y$Ga$_{1-x-y}$N (0<x, y<1) buffer layer 331: 50 nm

Undoped (or n$^-$-type layer) GaN layer 332: 0.5 micron n-type GaN clad layer 302: 4.0 microns Undoped In$_x$Ga$_{1-x}$N active layer 303: 0.1 micron p-type GaN clad layer 304: 0.5 micron n-type GaN cap layer 305: 0.1 micron where the n-type GaN cap layer 305 is formed on a part of the top surface of the p-type GaN clad layer 304, while on the top surface of the n-type GaN cap layer 305 and a part of the top of the p-type GaN clad layer 304 where that cap layer 305 is not formed, a thin film metal (conductive, light-transmitting film) layer 306 which acts as a transparent electrode layer through which light can pass is formed. To inject current in the active layer 303, cathode electrode 307 and anode electrode 308 are respectively formed on a part of the top surface of the n-type GaN clad layer 302 and a part of the top surface of a thin-film metal layer 306 positioned above the n-type GaN cap layer 305. An n-type In$_x$Al$_y$Ga$_{1-x-y}$N buffer layer 331 serves as a layer to relax the lattice mismatching between the sapphire substrate 301 and the overlying epitaxial-growth layers 332, 302, 303, 304, and 305. The buffer layer 331 may come in a p-type In$_x$Al$_y$Ga$_{1-x-y}$N layer. The layer 332, which should preferable by undoped though, will give a certain effect as long as its impurity concentration is less than that of the overlying n-type GaN clad layer 302. That is, by forming the undoped or low-impurity concentration GaN layer 332, it is possible to maintain good surface morphology even if the impurity concentration of the overlying n-type GaN clad layer 302 is increased. Although a Si concentration of approximately $5\times10^{19}$ cm$^{-3}$ is a threshold value to avoid a poor surface morphology in the case where, for example, an n-type GaN layer is grown directly on the buffer layer 331, the n-type impurity concentration can be increased up to $8\times10^{19}$ cm$^{-3}$ by forming the undoped or ne-type GaN layer 332.

During the manufacturing process, the n-type GaN cap layer 305 according to the present invention is formed a little thicker (1.0 micron) than the final design film thickness throughout the top surface of the p-type GaN clad layer 304, thus preventing the Mg atoms as acceptors from being passivated by atomic H. Finally, however, as shown in FIGS. 3A and 3B, the n-type GaN cap layer 305 is formed only on a part of the top surface of the p-type GaN clad layer 304, functioning as a current-blocking layer. Its thickness is also smaller than that of as-grown thickness. That is, this n-type GaN cap layer 305 can be used to form a current-blocked structure, which relates to an advantage of the present invention. That is, the anode electrode 308 formed on the device top surface is given to prevent the light from being taken out, so that a current injected just under this anode electrode 308 is transformed into a reactive current which does not contribute to external emission; this reactive component, however, can be reduced by a current-blocked structure, thus improving the overall luminous efficiency. By the conventional current-blocked structures, after the epitaxial growth is carried out to obtain desired stacked structure, a low-temperature CVD furnace etc. is used to deposit an oxide film (SiO$_2$ film) etc. on the surface of the stacked structure, which is then formed as the current blocking layer by reactive ion etching (RIE) and photolithographic technology to reduce the abovementioned reactive current. On the contrary, by the structure according to the present invention, the n-type GaN cap layer 305 can be used as it is as the current blocking layer. In order to carry out CVD processing of SiO$_2$ film on the surface of the epitaxially grown stacked structure as by the prior art, it is of course necessary to perform pre-processing steps such as the cleaning of the surface of the stacked structure and, for each of those pre-processing steps, a few attendant steps increase. Further the difference of the thermal expansion coefficient between the SiO$_2$ film and GaN based semiconductor causes a strain in the device structure, which deteriorates the device performances. The present invention, therefore, can simplify the processing steps, thereby constituting an excellent structure having high current-injection efficiency and efficient light extraction, simply and readily.

Next, a method for manufacturing a GaN based LED shown in FIGS. 3A and 3B according to the first embodiment of the present invention is described with reference to FIGS. 3A and 4A through 4C.

Figure 4A:
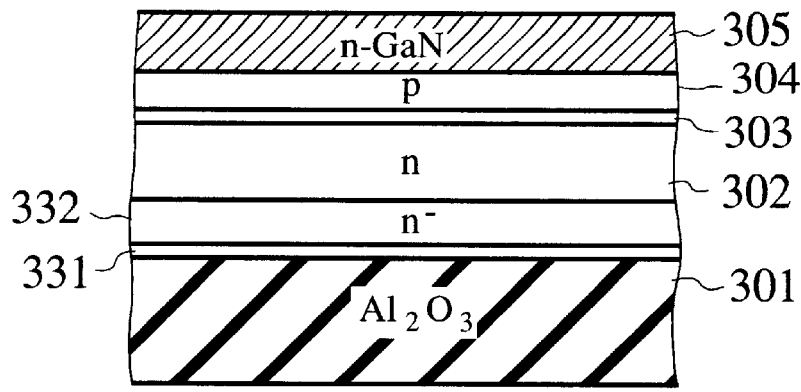
FIGS. 4A through 4C depict steps for manufacturing an LED shown in FIGS. 3A and 3B.

(a) As shown in FIG. 4A, on the sapphire substrate 301 are consecutively grown, using VPE growth technologies such as the MO-CVD method etc., the 50 nm-thick n-type In$_x$Al$_y$Ga$_{1-x-y}$N buffer layer 331, the 0.5 micron-thick undoped (or n$^-$type) GaN layer 332, the 4.0 micron-thick n-type GaN clad layer 302, the 0.1 micron-thick undoped $In_xGa_{1-x}N$ active layer 303, the 0.5 micron-thick p-type GaN clad layer 304, and the 1.0 micron-thick n-type GaN cap layer 305 in this order. For example, a high-frequency (RF) induction heating reduced pressure MO-CVD furnace (or atmospheric MO-CVD furnace) may be used to introduce, in epitaxial growth, a column-III element source gas such as a metalorganic compound and a column-V element source gas such as $NH_3$ at a prescribed substrate temperature. More specifically, at a substrate temperature of 850° C. to 1200° C., trimethylgallium ($Ga(CH_3)_3$), trimethylindium ($In(CH_3)_3$), or trimethylaluminum ($Al(CH_3)_3$) as a column-III element source gas and $NH_3$ as a column-V element source gas may be introduced on the surface of the substrate. In the epitaxial growth, those source gases are introduced together with a carrier gas comprising $H_2$ or $N_2$. The growth pressure may be, for example, about 1 kPa to 100 kPa. Under those conditions, GaN based semiconductors of the n-type $In_xAl_yGa_{1-x-y}N$ buffer layer 331 through the n-type GaN cap layer 305 are consecutively grown, during which the respective flow rates of the reaction gases are switched (or a part of source gas supply is stopped completely), to control the component of each of the $In_xAl_yGa_{1-x-y}N$, GaN, and $In_xGa_{1-x}N$ layers. After the p-type GaN clad layer 304 is grown in particular, only a carrier gas and an $NH_3$ gas are supplied to carry out "growth interruption" treatment for one to 20 minutes while keeping the substrate temperature at the growth temperature, to subsequently grow an n-cap layer. Also, to add an impurity, $SiH_4$ and $Cp_2Mg$ etc. are introduced as required, to control the levels of prescribed n-type and p-type impurity concentrations.

Figure 4B:
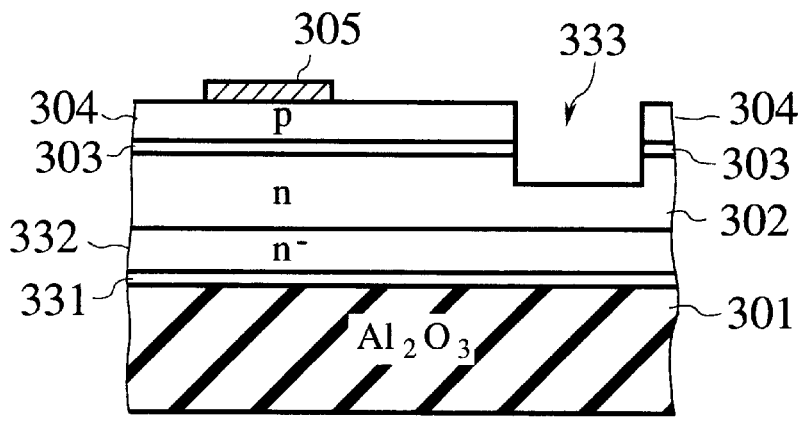

(b) The sapphire substrate 301 on which the n-type buffer layer 331 through the cap layer 305 are consecutively deposited is taken out of the MO-CVD furnace, to reduce the thickness of the n-type GaN cap layer 305 down to 0.1 micron by etching, or CMP (chemical mechanical polishing), etc. Then, as shown in FIG. 4B, a U-shaped trench 333 is formed which reaches the n-type GaN clad layer 302. Subsequently, a part of the n-type GaN cap layer 305 is selectively removed to expose the p-type GaN clad layer 304 as shown in FIG. 4B. The U-shaped trench 333 serves later to form the cathode electrode 307 at its bottom. Such geometry as shown in FIG. 4B can be realized by known etching technologies such as electron-cyclotron-resonance (ECR) plasma etching, ion milling, and RIE, employing photolithographic technology.

Figure 4C:
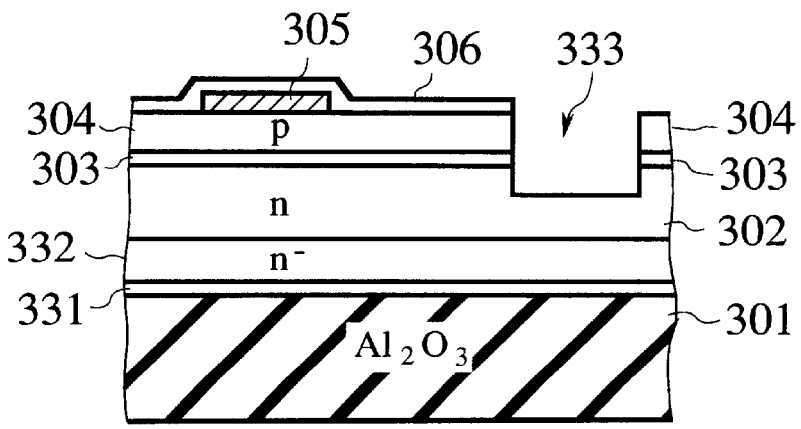

(c) The transparent electrode layer 306 made of a metal thin film or ITO is deposited by the sputtering, vacuum evaporation, or CVD method. Then, the transparent electrode layer 306 is cut as shown in FIG. 4C by use of the photolithographic technology. Or, the patterning of the transparent electrode may be performed by using so-called "the lift-off method", forming the pattern of the transparent electrode layer 306 in the window part of the photoresist film.

(d) Turning now to FIG. 3A, the cathode electrode 307 is formed at the bottom of the U-shaped trench 333 and the anode electrode 308, on the transparent electrode layer 306 positioned above the n-type GaN cap layer 305. Both the cathode electrode 307 and the anode electrode 308 may be formed by the lift-off method. That is, all the portions other than those where the cathode electrode 307 is expected to be formed are covered with the photoresist film, to deposit a metal material such as gold (Au), titanium (Ti), aluminium (Al), or nickel (Ni) by the sputtering method or the vacuum evaporation method and subsequently remove the photoresist film, so that the cathode electrode 307 can be formed only in the window part of the photoresist film at a prescribed position on the bottom of the U-shaped trench 333. This holds true also of the anode electrode 307.

(e) When the basic structure of a GaN based LED has been finished in this way, the wafer is cut into dice. That is, the wafer is cut with a diamond cutter along its scribe lines, which are mesa-etched beforehand, into a number of dice having a prescribed size. Those dice are mounted on a prescribed base (wire frame) then undergo wire bonding and molding steps in this order, to complete a GaN based LED according to the present invention. Note here that the sapphire substrate should preferably be of a thickness of 60 to 100 microns, so as to improve the dicing yield and the device performances.

An advantage of the manufacturing method according to the first embodiment of the present invention over that according to the prior art is the process simplification described above. That is, according to the first embodiment of the present invention, only by adding a simple step of forming the n-type GaN cap layer 305 at the end of the consecutive epitaxial growth which is employed by the prior art, so that it becomes possible to inhibit passivation of the acceptor caused by adsorption of atomic H (therefore, the number of necessary steps is not increased eventually). This feature can simplify the manufacturing steps significantly, and eliminate the complicated additional processes such as LEEBI treatment and thermal annealing required for activation of acceptor atoms in the GaN clad layers by the prior art. Another advantage of the manufacturing method according to the present invention is that, as mentioned above, the n-cap layer 305 can be used to form a current-blocked structure. That is, the present invention eliminates a necessity to provide a current-blocked structure with additional steps of oxide-film formation etc. by use of the CVD method or the sputtering method, so that the fabrication steps can be simplified, to obtain a high external quantum efficiency.

By using a device structure according to the first embodiment of the present invention to change the In mole fraction contained in the $In_xGa_{1-x}N$ active layer from 0 to 0.6, it is possible to emit light ranging in wavelength from the UV through visible lights (violet to green). The lights can be irradiated from everywhere on the device surface not covered by the anode electrode, thus realizing the LEDs of high-brightness and high luminous efficiencies.

Figure 5:
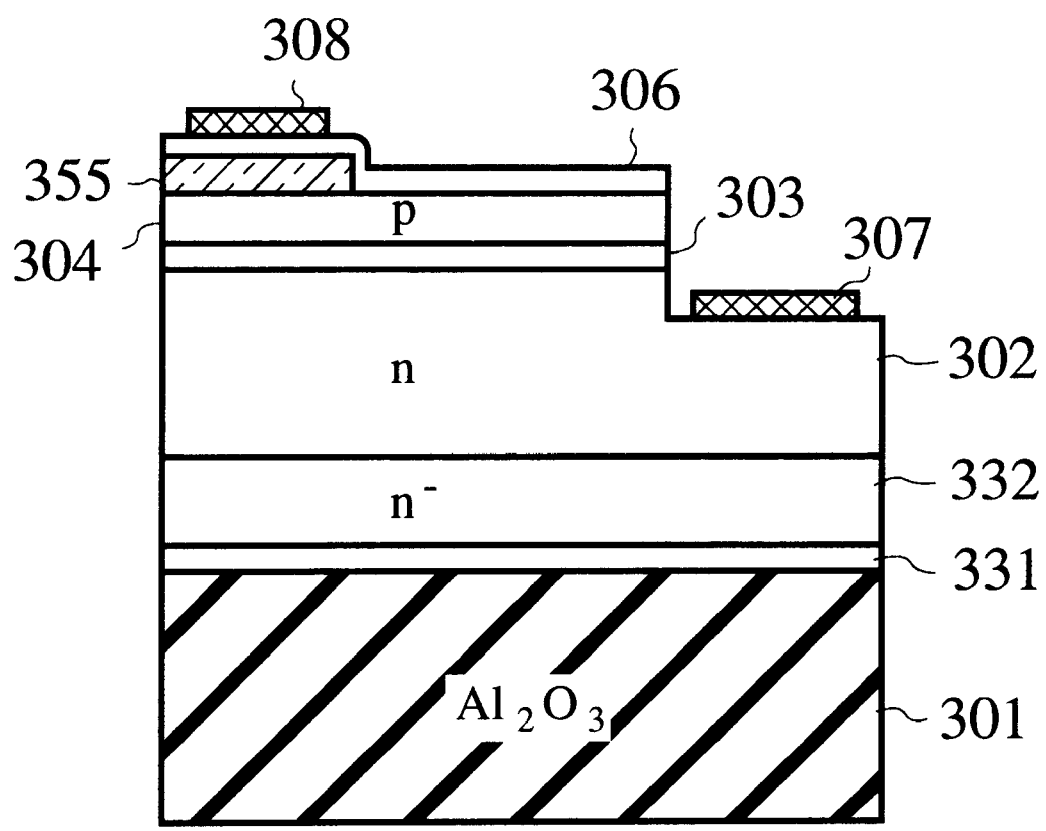
FIG. 5 is a cross-sectional view of a GaN based semiconductor LED related to a modification of the first embodiment of the present invention.

FIG. 5 is a cross-sectional view outlining an LED made of GaN based materials related to a modification of the first embodiment of the present invention. This LED structure is similar to the structure shown in FIG. 3A, and on the sapphire substrate 301 are stacked an $In_xAl_yGa_{1-x-y}N$ layer, a GaN layer, and an $In_xGa_{1-x}N$ layer having the respective thicknesses, but having n-type $In_uAl_vGa_{1-u-v}N$ cap layer (0<u, v<1) as follows.

n-type $In_xAl_yGa_{1-x-y}N$ buffer layer 331 (0≦x, y≦1): 50 nm

Undoped (or $n^-$-type layer) GaN layer 332: 0.5 micron n-type GaN clad layer 302: 4.0 microns Undoped $In_xGa_{1-x}N$ active layer 303: 0.1 micron p-type GaN clad layer 304: 0.5 micron n-type $In_uAl_vGa_{1-u-v}N$ cap layer 355 (0<u, v<1): 0.1 micron where the n-type $In_uAl_vGa_{1-u-v}N$ cap layer (hereinafter called "n-type InAlGaN cap layer") 355 (0<u, v<1) is formed on a part of the top surface of the p-type GaN clad layer 304 and the thin-film metal (conductive, light-transmitting film) layer 306 is formed on the top surface of the n-type InAlGaN cap layer 355 and a part of the top surface of the p-type GaN clad layer 304 where the n-type InAlGaN cap layer 355 is not formed. The cathode electrode 307 and anode electrode 308 for injecting carriers in the active layer 303 are respectively formed on a part of the surface of the n-type GaN clad layer 302 and a part of the top surface of the thin-film metal layer 306 positioned above the n-type InAlGaN cap layer 355. Also, the n-type $In_xAl_yGa_{1-x-y}N$ buffer layer 331, which may be a p-type $In_xAl_yGa_{1-x-y}N$ buffer layer, serves to relax the lattice mismatching between the sapphire substrate and each of the overlying epitaxial-growth layers 332, 302, 303, 304, and 355. That is, either of the conductivity type will be enough for the buffer layer 331. The layer 332, which should preferably be of an undoped type, is all right as far as its impurity concentration is less than that of the overlying n-type GaN clad layer 302, because it only serves to prevent the occurrence of roughness in the surface morphology.

The n-type InAlGaN cap layer 355 related to a modification of the first embodiment of the present invention is formed to a thickness (1.5 microns) larger than a final (designed) film thickness throughout the top surface of the p-type GaN clad layer 304 halfway the manufacturing process, thus preventing Mg, an acceptor, from being passivated by atomic H. That is, as being understood from FIG. 2B, by forming the InAlGaN cap layer 355 to a thickness of 1.0 micron or more, Mg can be prevented from being passivated by atomic H. Finally, however, as shown in FIG. 5, the n-type InAlGaN cap layer 355 is formed only on a part of the top surface of the p-type GaN clad layer 304, serving as a current-blocking layer. Also, its thickness is made smaller than the as-grown thickness immediately after it has undergone epitaxial growth. That is, as shown in FIG. 3A, a current-blocked structure is realized by using this n-type InAlGaN cap layer 355. It is, therefore, possible to easily achieve a high external quantum efficiency.

Next, a method of manufacturing a GaN based LED related to a modification of the first embodiment of the present invention is described with respect to FIGS. 6A through 6C as follows.

Figure 6A:
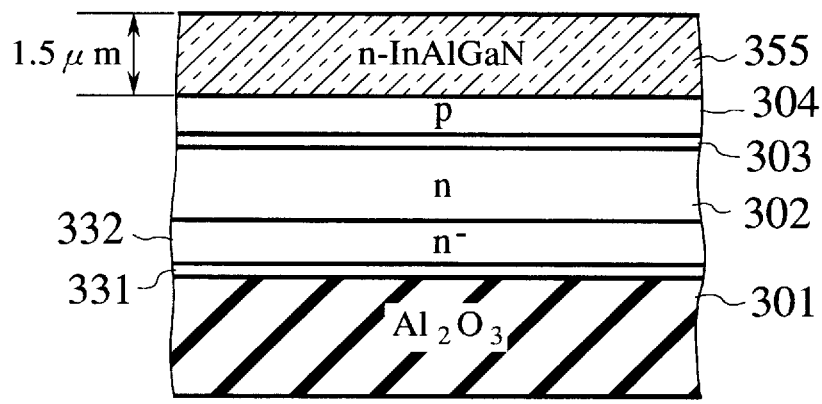
FIGS. 6A through 6C depict steps for manufacturing an LED shown in FIG. 5.
Figure 6B:
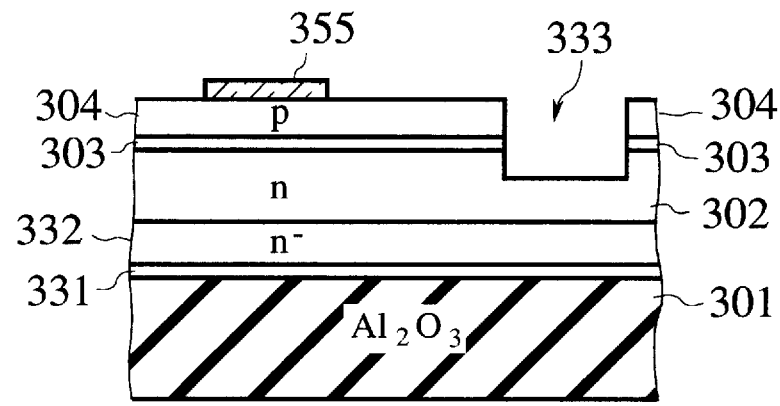

(a) As shown in FIG. 6A, on the sapphire substrate 301 are consecutively grown, by using epitaxial growth method such as the MO-CVD method etc., the 50 nm-thick n-type $In_xAl_yGa_{1-x-y}N$ buffer layer 331, the 0.5 micron-thick undoped (or n$^-$-type) GaN layer 332, the 4.0 micron-thick n-type GaN clad layer 302, the 0.1 micron-thick undoped $In_xGa_{1-x}N$ active layer 303, the 0.5 micron-thick p-type GaN clad layer 304, and the 1.5 micron-thick n-type InAlGaN cap layer 355 in this order. As mentioned above, the buffer layer 331 may be a p-type $In_xAl_yGa_{1-x-y}N$ layer. However, the buffer layer 331 should preferably be of an n-type taking into account the exchanging process of dopant gases during the consecutive growth. During this consecutive epitaxial growth, after the p-type GaN clad layer 304 is grown in particular, only a carrier gas and an NH$_3$ gas are supplied, so that the "growth interruption" treatment is carried out for one to 20 minutes with the substrate temperature kept at a growth temperature. Subsequently, after the growth interruption treatment, the n-type InAlGaN cap layer 355 is grown to a thickness of 1.5 microns.

(b) Next, the sapphire substrate 301 on which the n-type buffer layer 331 through the n-type InAlGaN cap layer 355 are consecutively deposited is taken out of the CVD furnace. And the thickness of the n-type InAlGaN cap layer 355 is reduced down to 0.1 micron by using the etching method or the CMP method, etc. Then, as shown in FIG. 6B, a U-shaped trench 333 is formed which reaches the n-type GaN clad layer 302. And subsequently a part of the n-type InAlGaN cap layer 355 is selectively removed to expose the p-type GaN clad layer 304 as shown in FIG. 6B. This patterning process can be carried out easily and accurately with no over-etching because InAlGaN crystal has a flexible nature presenting small resistance to dry etching and has a large etching selectivity against GaN. The U-shaped trench 333 subsequently serves to form the cathode electrode 307 at its bottom. Such geometry as shown in FIG. 6B can be provided by the known dry etching technologies such as the RIE with an aid of photolithographic technology, etc.

Figure 6C:
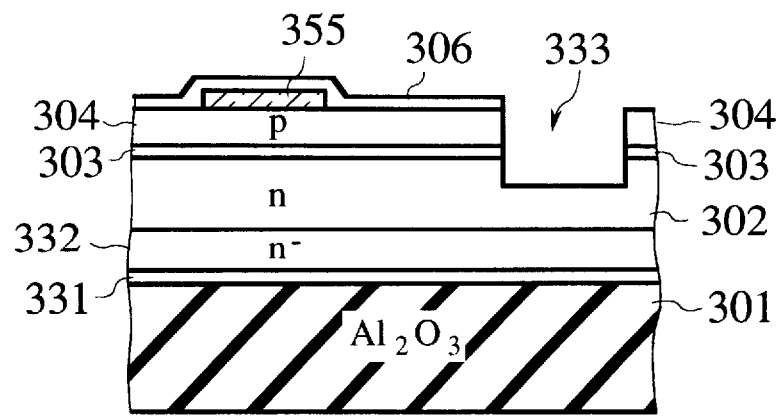

How to form the transparent electrode layer 306 and the subsequent cathode electrode 307 and the anode electrode 308 shown in FIG. 6C is the same as that already shown in FIGS. 4C and later and is not described here.

Although the above has been described with reference to a current-blocked structure, the n-type InAlGaN cap layer 355 may be removed completely after consecutive epitaxial growth. As far as the In mole fraction u=0.1 approximately, the n-type InAlGaN layer 355 can have an etching rate ratio of 1.3:1 by RIE as against the underlying p-type GaN clad layer 304, thus preventing overetching. By further increasing the In mole fraction u, the selectivity can of course be increased even more. Also, endpoint monitoring is possible by monitoring the reaction products during the RIE processing by means of the infrared (IR)-absorption spectroscopy, the Raman scattering spectroscopy, the mass spectroscopy (quadrupole mass spectrometry), etc. Thus, because of its flexible nature, InAlGaN crystal is easy to delineate and also to carry out endpoint monitoring by measuring the reaction products containing In, so that its layer can be easily removed even if it has been deposited as thick as 1 micron or more. It is, therefore, much the more certain that Mg atom can be prevented from being passivated. The n-type InAlGaN 355 can of course be deposited as thick as 2 microns or larger.

The first embodiment of the present invention is not limited to the above-mentioned modifications as well as the structures and methods for manufacturing the same. That is, it can be applied also to more general GaN based LEDs, semiconductor lasers and photodetectors having $In_xAl_yGa_{1-x-y}N$ layers. Although the n-cap layers made of GaN or InAlGaN have been described above, almost the same effectiveness can be obtained also with other semiconductor materials as far as their electrical characteristics are of an n type. A variety of other modifications are possible without departing from the spirit and the scope of the present invention.

[Second Embodiment]

Figure 7A:
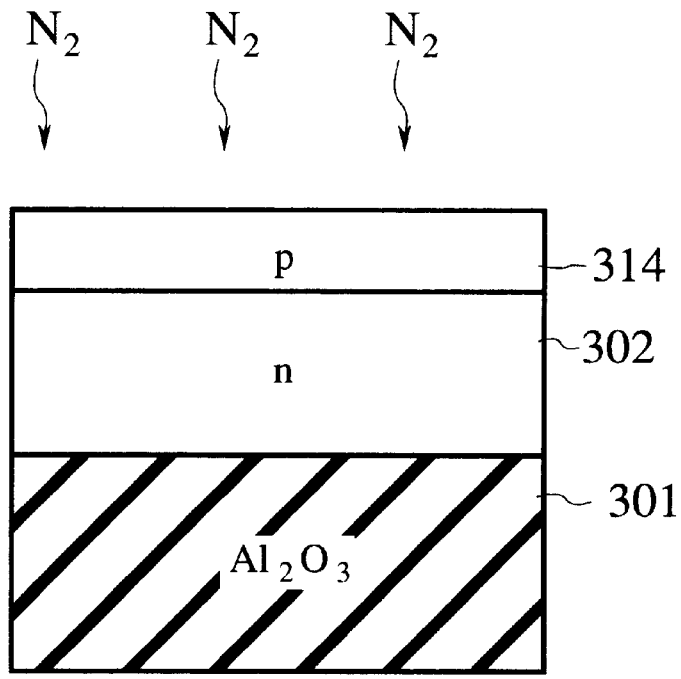
FIGS. 7A and 7B depict steps for manufacturing a stacked structure related to the second embodiment of the present invention.

FIG. 7A is a cross-sectional view of a stacked structure of a GaN based optoelectronic device related to the second embodiment of the present invention. As shown in it, on a main surface of a sapphire ($Al_2O_3$) substrate 301 are consecutively stacked a Si-doped n-type GaN layer 302 and a Mg-doped p-type GaN layer 314 in this order. Those layers are grown and stacked by the MOCVD method or any other VPE growth method using NH$_3$ as a column-V element source gas; TMG, TEG, etc. as a column-III element source gas; and Cp$_2$Mg, SiH$_4$ as a dopant gas in a carrier gas of N$_2$ or a mixed gas of H$_2$/N$_2$. The substrate temperature at time of growth should preferably be, for example, 1050° C. Those layers have the following film thicknesses:

n-type GaN layer 302: 2.0 microns p-type GaN layer 314: 1.0 micron

After this stacked structure is grown, the substrate temperature is lowered to the room temperature. During a process wherein the substrate temperature is lowered from the growth temperature down to the room temperature, the gas in the growth chamber in which above stacked structure is grown is switched to $N_2$. In review, during the conventional process of lowering the substrate temperature after crystal growing, an $NH_3$ gas, a column-V element source gas, had been supplied to prevent the desorption of N from the surface of the crystal-grown layers; the atomic H given as a result of thermal cracking of this $NH_3$ gas had passivated the acceptor atoms to be contained in the crystals. On the contrary, according to the second embodiment of the present invention, it is possible to prevent atomic H from being produced by stopping supply of $NH_3$ at time of lowering the substrate temperature, thereby increasing the activation ratio of the acceptor atoms. In fact, measurement of the effective carrier concentration by use of the C-V method confirmed that about 10% of acceptor atoms contained in the crystals of the Mg-doped GaN layer 314 according to the second embodiment of the present invention were activated, being greatly higher than the activation ratio of 1% in the case where the conventional temperature-lowering process is used in the $NH_3$ ambient according to the prior art. If a $H_2/N_2$ mixed gas is used as the carrier gas during growth, it is enough to change the carrier gas only to $N_2$, by stopping the supply of $H_2$ gas, column-III and column-V element source gases after growth completion, and lower the substrate temperature. Alternatively, the $H_2/N_2$ mixing ratio of the carrier gas may be (or may change to be) a $N_2$-rich gas of the $N_2$ contents being 90% or more. In this case, etching effects due to $H_2$ must be taken into account.

Taking into consideration the convenience in switching and/or adjustment of the $N_2$ or a $N_2$-rich mixing ratio between $H_2$ and $N_2$ in a carrier gas at time of lowering the substrate temperature, it is preferable to supply a $N_2$ gas or a $N_2$-rich mixed gas of $H_2/N_2$ as the carrier gas used at time of epitaxial growth of the n-type GaN layer 302 and the p-type GaN layer 314. By supplying a $N_2$ gas or any other inert gas as the carrier gas used during epitaxial growth, the process can shift to the temperature lowering step directly, making the second embodiment of the present invention much the more advantageous.

A supply of $NH_3$ during the temperature lowering step may be stopped at somewhere between the growth temperature and 400° C. Preferably, the $NH_3$ supply can be stopped at somewhere between 900° C. and 400° C., taking into account the desorption of N from the surface of the crystals. Also, a small quantity of $NH_3$ may be added because the production of atomic H depends on the flow rate of $NH_3$. And as far as the $NH_3$ supply is about 10% of the $NH_3$ flow rate required for crystal growing, the N desorption from the crystal surface can be prevented. Hence, the substrate temperature may be lowered in an inert ambient gas to which a small quantity of $NH_3$ is added, during the temperature lowering step under such conditions.

Figure 7B:
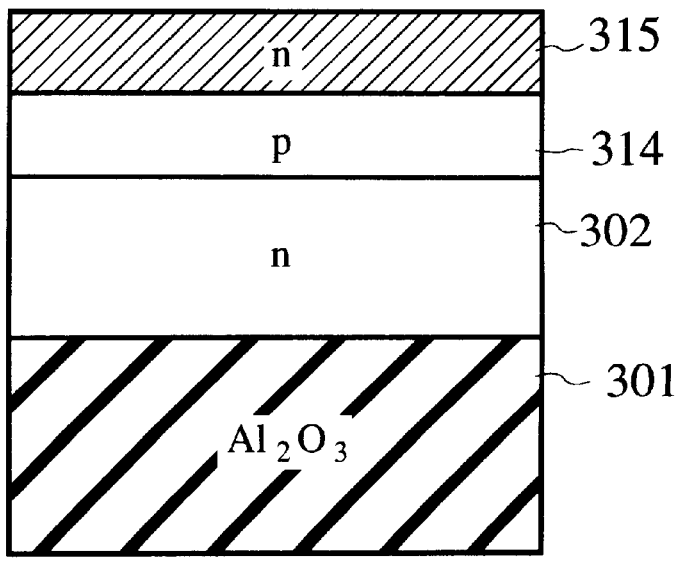

Like in the case of the first embodiment, as shown in FIG. 7B, the n-cap layer 315 may be formed on the p-type GaN layer 314, before lowering the substrate temperature from growth temperature to the room temperature in a $N_2$ or $N_2$-rich carrier gas. As the n-cap layer 315, an n-type InAlGaN cap layer should preferably be deposited as thick as 1 micron or more. Also, n-type $In_xAl_yGa_{1-x-y}N$ layers and undoped (or $n^-$-type) GaN layers are formed and then, the n-type GaN layer 302 may of course be formed on those layers.

An advantage of the second embodiment of the present invention over the prior art is process simplification. That is, according to the second embodiment of the present invention, only by carrying out a modified step of supplying only a $N_2$ or $N_2$-rich carrier gas at the end of the conventional consecutive epitaxial growth employed in the prior art to lower the substrate temperature, it is possible to inhibit passivation of acceptor atoms due to the incorporation of atomic H into the p-type GaN clad layer 304. Therefore, the number of required steps in the second embodiment is not increased eventually, compared with the prior art. This advantage enables significant simplification of manufacturing in that complicated extra processes such as LEEBI treatment, thermal annealing, etc. required by the prior art to activate acceptor atoms in the p-type GaN clad layers can be eliminated.

The second embodiment of the present invention is not limited to the structure shown in FIGS. 7A and 7B. Although the GaN layer 315 has been used as the n-cap layer in FIG. 7B, any other semiconductor materials such as the above-mentioned n-type InAlGaN etc. are adaptable to the n-cap layer providing the same effects, as far as their electrical characteristics are of an n type. Also, although the second embodiment of the present invention can be applied not only to light-emitting diodes but also to other optoelectronic devices such as semiconductor lasers and photodetectors. Although a $N_2$ gas and a $N_2$-rich mixed gas of $H_2/N_2$ have been used as an atmospheric gas at time of temperature lowering, the same effects can be obtained also with an inert gas such as Ar, He, etc. or their mixed gas. A variety of other modifications are possible without departing from the spirit and the scope of the present invention.

[Third Embodiment]

Figure 8A:
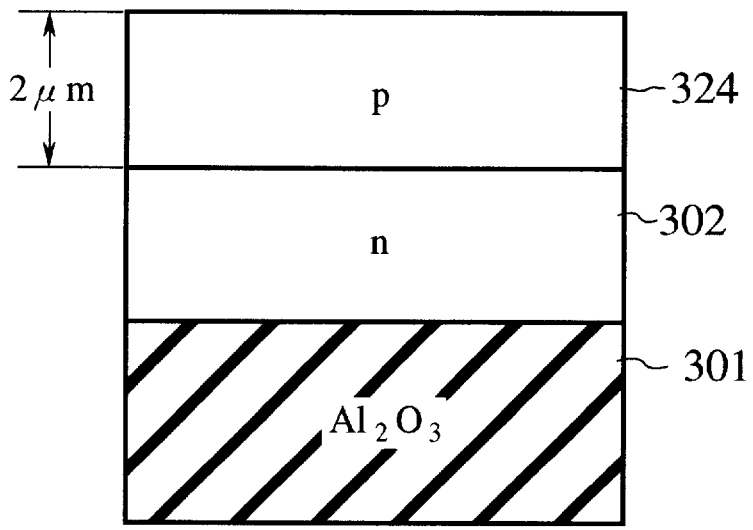
FIGS. 8A and 8B depict steps for manufacturing a stacked structure related to the third embodiment of the present invention.

FIG. 8A is a cross-sectional view of a stacked structure of a GaN based optoelectronic device related to the third embodiment of the present invention. As shown in it, on one main surface of a sapphire ($Al_2O_3$) substrate 301 are consecutively stacked an Si-doped n-type GaN layer 302 and a Mg-doped p-type GaN layer 324 in this order. Those layers may be grown and stacked by the MOCVD method or other VPE growth method by using $NH_3$ as a column-V element source gas; TMG, TEG, etc. as a column-III element source gas; $Cp_2Mg$, $SiH_4$, etc. as a dopant gas; and a mixed gas of $H_2/N_2$ etc. as a carrier gas. The substrate temperature at time of growth should preferably be 1050° C. Those layers have the following thicknesses:

n-type GaN layer 302: 2.0 microns p-type GaN layer 324: 2.0 microns

Figure 8B:
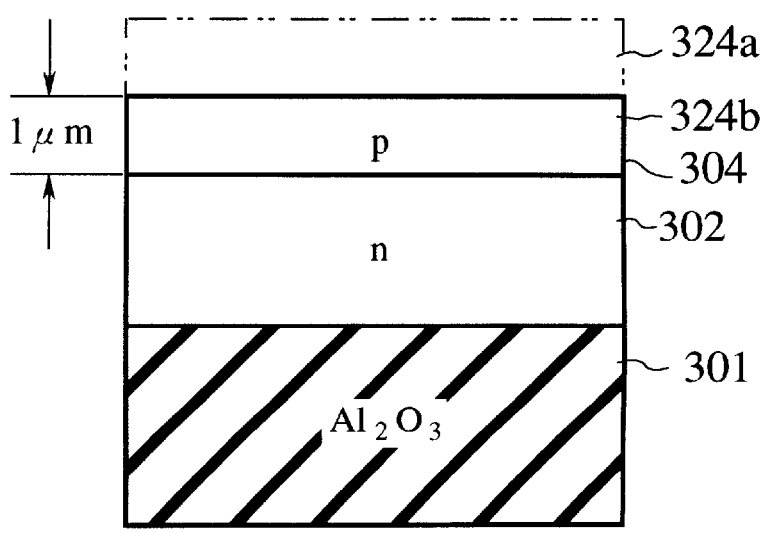

According to the third embodiment of the present invention, a final desired thickness of the p-type GaN layer is 1.0 micron, while the p-type GaN layer 324 is deposited to a preliminary thickness of 2.0 microns, larger than a desired thickness, as shown in FIG. 8A. In contrast to the second embodiment, the third embodiment of the present invention employs a $H_2/N_2$ mixed ambient gas with the $H_2$ contents being 10% or more during the lowering of the substrate temperature after the completion of the epitaxial growth. If a growth layer is exposed to $H_2$ at a high temperature, the film is thinned because of the vapor-phase etching, so that the crystals will be lost when allowed to stand as they are for a long lapse of time. To guard against this, the prior art inhibits the vapor-phase etching by supplying $NH_3$ at the same time. If $NH_3$ is supplied, however, atomic H is generated in an undesirable manner to passivate acceptor atoms. Therefore, the embodiments of the present invention sets the preliminary film thickness a bit larger than a final one beforehand taking into account the vapor-phase etching effects due to $H_2$, to allow decrease of the film thickness during the temperature lowering step in a $H_2$ gas or a $H_2/N_2$ mixed gas—the $H_2$ contents being 10% or more—thus inhibiting the passivation of the acceptor atoms caused by atomic H. That is, according to the third embodiment of the present invention, after crystals of such a stacked structure having the preliminary thickness as shown in FIG. 8A are grown completely, a supply of $NH_3$ and other source gases is stopped to supply a $H_2/N_2$ mixed gas with the $H_2$ contents being 10%. It is preferable that the substrate temperature is lowered at a cooling rate of 50° C./min in the temperature lowering step. As as result, as shown in FIG. 8B, the Mg-doped GaN layer 324a included in the preliminary thickness is etched in a vapor phase by about 1.0 micron down to a resulting 1-micron thick Mg-doped GaN layer 324b. Measurement of the effective carrier concentration by the C-V method on thus obtained Mg-doped GaN layer 324b showed a result that about 8% of the acceptor atoms contained in the crystals were activated, being higher than that by the prior art (1%) in the case where the substrate temperature is lowered in $NH_3$ ambient.

An advantage of the third embodiment of the present invention over the prior art is simplification of the processes required. That is, according to the third embodiment of the present invention, during conventional consecutive epitaxial growth employed in the prior art, only by carrying out an improved step, namely, only by growing a film thickness a bit larger than a final thickness and then lowering the temperature in a $H_2$ ambient, it is possible to inhibit passivation of acceptor atoms caused by incorporation of atomic H into the p-type GaN clad layer 324b—therefore, the number of required steps for crystal growth is not increased eventually. This feature can simplify the processing significantly in a respect that complicated additional processes such as LEEBI treatment and thermal annealing, etc. required by the prior art to activate acceptor atoms in the p-type GaN clad layers can be eliminated.

The third embodiment of the present invention is not limited to such a structure as shown in FIGS. 8A and 8B. It is of course possible, like in the case shown in FIG. 3A, to form the n-type $In_xAl_yGa_{1-x-y}N$ buffer layer and the undoped (or n⁻-type) GaN layer on the sapphire substrate 301 and then form the n-type GaN layer 302. The present embodiment can be applied also to DH light-emitting diodes and semiconductor lasers and other optoelectronic devices such as photodetectors without departing the spirit and the scope of the present invention.

Various modifications will become possible for those skilled in the art after receiving the teachings of the present disclosure without departing from the scope of thereof.

What is claimed is:

1. A GaN based optoelectronic device having a stacked structure comprising:

a light-emitting region;

an n-type semiconductor region for injecting electrons into the light-emitting region, disposed under the light-emitting region;

a p-type semiconductor region disposed on the light-emitting region, for injecting holes into the light-emitting region; and an n-cap layer consisting of $In_uAl_vGa_{1-u-v}N$ (0<u, v<1), formed on a top surface of the p-type semiconductor region.

2. A GaN based optoelectronic device having a stacked structure comprising:

an n-type clad layer;

an active layer having a narrower bandgap than the n-type clad layer, positioned on a top surface of the n-type clad layer;

a p-type clad layer having a wider bandgap than the active layer, positioned on a top surface of the active layer; and an n-cap layer consisting of $In_uAl_vGa_{1-u-v}N$ (0<u, v<1), positioned on a top surface of the p-type clad layer.

3. The optoelectronic device of claim 2, wherein said n-cap layer is formed on a part of a top surface of said p-type clad layer.

4. A GaN based optoelectronic device having a stacked structure comprising:

an n-type clad layer;

an active layer positioned on a top surface of the n-type clad layer;

a p-type clad layer positioned on a top surface of the active layer:

an n-cap layer positioned on a part of a top surface of the p-type clad layer; and a transparent electrode layer formed on a top surface of said n-cap layer and a portion of a top surface of a p-type clad layer where said n-cap layer is not formed.

5. The optoelectronic device of claim 4, further comprising:

an anode electrode formed on a top surface of said n-cap layer with said transparent electrode layer sandwiched therebetween.

6. The optoelectronic device of claim 4, wherein said stacked structure made of GaN based semiconductors is formed on a sapphire substrate.

7. The optoelectronic device of claim 4, wherein said n-cap layer is as thick as 0.1 micron or more.

8. The optoelectronic device of claim 7, wherein an impurity concentration of donor impurities in said n-cap layer is $2 \times 10^{18}$ cm$^{-3}$ through $5 \times 10^{19}$ cm$^{-3}$ and an impurity concentration of acceptor impurities in said p-type clad layer is substantially $1 \times 10^{20}$ cm$^{-3}$.

9. A GaN based optoelectronic device having a stacked structure comprising:

an n-type semiconductor region and a p-type semiconductor region for injecting electrons and holes into a light-emitting region, respectively; and an n-cap layer having a thickness of substantially 1 micron or greater, disposed on a top surface of the p-type semiconductor region.

10. The optoelectronic device of claim 9, wherein the thickness of said n-cap layer is between 1 micron and 2 microns.

11. A GaN based optoelectronic device having a stacked structure comprising:

an n-type clad layer;

an active layer disposed on a top surface of the n-type clad layer;

a p-type clad layer having a hydrogen (H) concentration of less than $5 \times 10^{18}$ cm$^{-3}$, disposed on a top surface of the active layer;

an n-cap layer disposed on a part of a top surface of said p-type clad layer; and a transparent electrode layer formed on a top surface of said n-cap layer and a portion of the top surface of said p-type clad layer where said n-cap layer is not formed.

* * * * *

UNITED STATES PATENT AND TRADEMARK OFFICE
CERTIFICATE OF CORRECTION

PATENT NO.   : 6,020,602
DATED        : February 1, 2000
INVENTOR(S)  : SUGAWARA et al.

It is certified that error appears in the above-identified patent and that said Letters Patent is hereby corrected as shown below:

Title Page, Item [54], in the Title, line 1, "GAN" should read --GaN--.

Title Page, Item [73], in the Assignee, line 1, "Toshba" should read --Toshiba--;

Claim 4, column 18, line 16, "layer:" should read --layer;--.

Signed and Sealed this

Seventeenth Day of April, 2001

*Attest:*

NICHOLAS P. GODICI

*Attesting Officer*   *Acting Director of the United States Patent and Trademark Office*